United States Patent [19]

Swiggett et al.

[11] Patent Number: 4,693,778
[45] Date of Patent: Sep. 15, 1987

[54] APPARATUS FOR MAKING SCRIBED CIRCUIT BOARDS AND CIRCUIT BOARD MODIFICATIONS

[75] Inventors: Brian E. Swiggett, Huntington; Ronald Morino, Sea Cliff; Raymond J. Keogh, Huntington, all of N.Y.; Jonathan C. Crowell, Lakeville, Mass.

[73] Assignee: Kollmorgen Technologies Corporation, Dallas, Tex.

[21] Appl. No.: 756,690

[22] Filed: Jul. 19, 1985

[51] Int. Cl.$^4$ .................. B23K 26/02; B23K 26/16; B29C 65/16

[52] U.S. Cl. .................. 156/361; 29/738; 29/850; 156/155; 156/272.8; 156/433; 156/499; 156/522; 156/523; 156/574; 156/380.9; 219/121 L; 219/121 LE; 219/121 LF

[58] Field of Search .................. 156/73.2, 155, 166, 156/176, 272.8, 380.9, 433, 436, 499, 522, 523, 574, 361, 423; 29/850, 738; 228/4.5, 904; 219/121 L, 121 LC, 121 LE, 121 LF, 121 LM

[56] References Cited

U.S. PATENT DOCUMENTS

| 3,674,602 | 7/1972 | Keogh et al. ............... 156/433 |
| 3,674,914 | 7/1972 | Burr ............................. 156/436 |
| 3,742,182 | 6/1973 | Saunders ..................... 156/155 |
| 3,866,398 | 2/1975 | Vernon, Jr. et al. ........ 156/643 |
| 3,960,309 | 6/1976 | Hazel ........................... 228/1.1 |
| 4,327,124 | 4/1982 | Des Marais ................. 29/846 |
| 4,414,741 | 11/1983 | Holt ............................ 29/836 |
| 4,450,623 | 5/1984 | Burr ............................ 29/850 |
| 4,541,882 | 9/1985 | Lassen ......................... 156/155 |
| 4,569,716 | 2/1986 | Pugh ............................ 156/523 |
| 4,588,468 | 5/1986 | McGinty ..................... 156/272.8 |

FOREIGN PATENT DOCUMENTS

| 113820 | 6/1984 | European Pat. Off. . |
| 21894 | 10/1984 | European Pat. Off. . |
| 136391 | 8/1984 | Japan . |
| 1504252 | 3/1978 | United Kingdom . |

OTHER PUBLICATIONS

Floury, et al., "An Automatic Wiring Equipment for Hybrid Substrates", Proc. 32nd Electronic Comp. Conf., May 1982.
Webizky, et al., "Making 100,000 Circuits Fit Where at Most 6,000 Fit Before", Electronics, vol. 52, No. 15, Aug. 2, 1979.
Miller, Carl, "Soldering With Light", Photonics Spectra, May 1983, pp. 83–85.
Loefler, Jr. J. R., N/C "Laser Soldering Fast, Low Cost, No Rejects," Assembly Engineering, Mar. 7, 1977, pp. 32–34.
Specifications, Augat, Inc., "Augat Planar Stitch Wiring", 1978.
"The Better Way to Perform Engineering Changes on Printed Circuits", Additive Technology Corp., The Wire Ink Company, 1983.

*Primary Examiner*—Michael Wityshyn
*Attorney, Agent, or Firm*—Morgan & Finnegan

[57] ABSTRACT

This invention relates to an apparatus for making circuit boards in which insulated conductors are applied and bonded to a nonconductive surface to form a conductive path between contact points thereon in a predetermined precise pattern.

21 Claims, 33 Drawing Figures

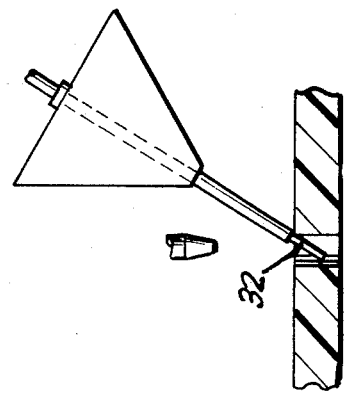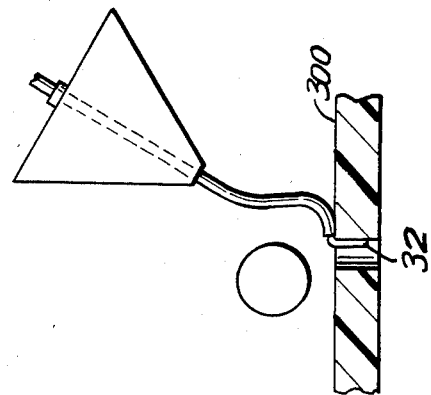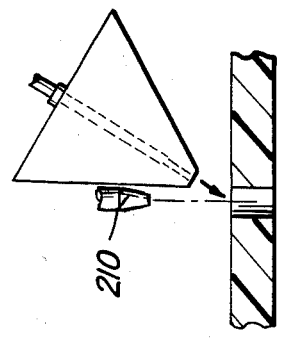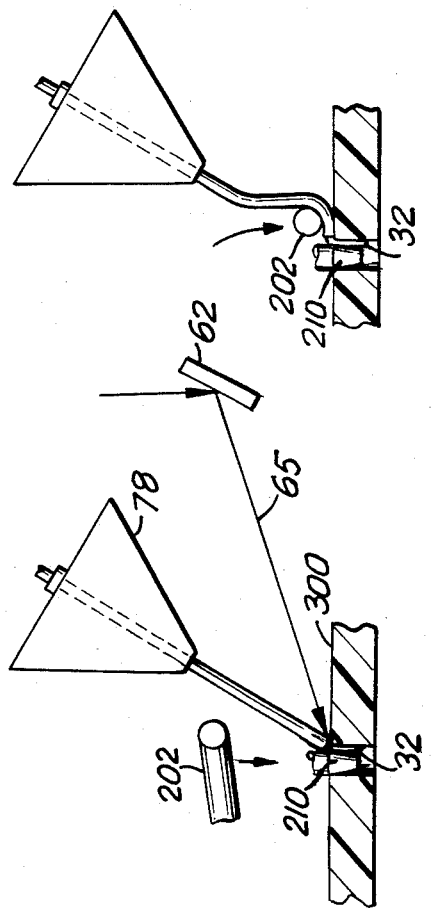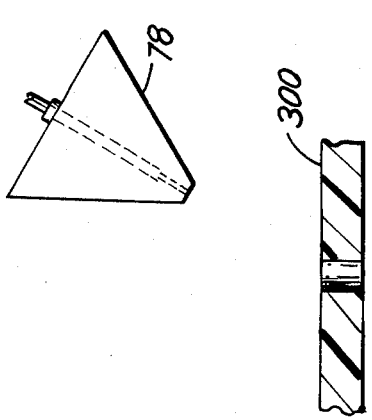

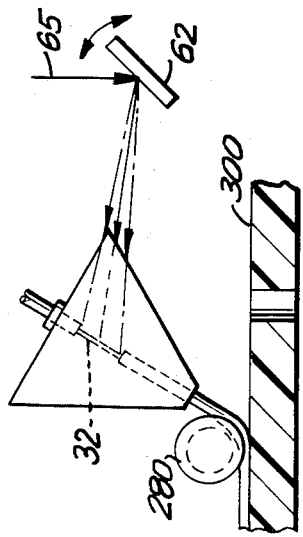
FIG.21(i)
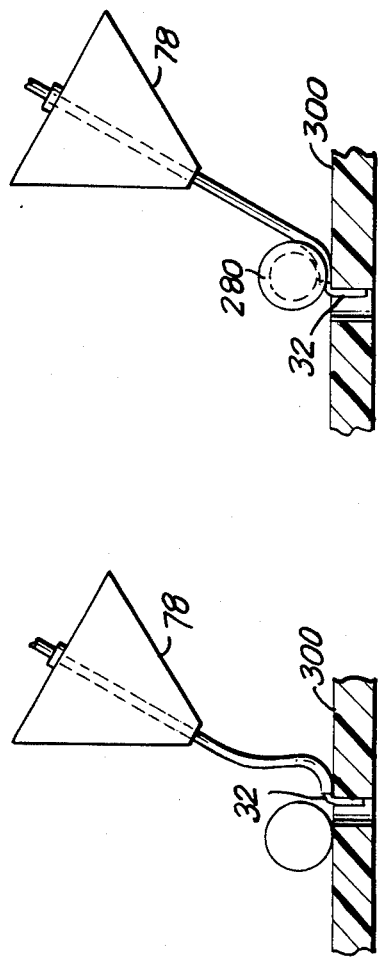
FIG.21(h)
FIG.21(g)
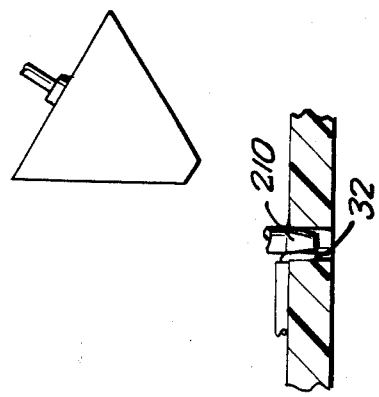
FIG.21(m)
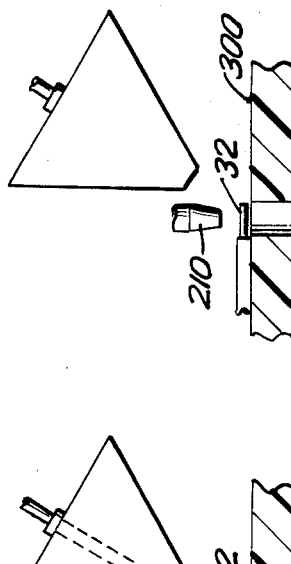
FIG.21(l)
FIG.21(k)
FIG.21(j)

APPARATUS FOR MAKING SCRIBED CIRCUIT BOARDS AND CIRCUIT BOARD MODIFICATIONS

This invention relates to apparatus for making circuit boards and, more particularly, to apparatus for making circuit boards in which insulated conductors are applied and bonded to a nonconductive surface to form a conductive path between contact points thereon. The conductors may be wires for electrical conduction or optical fibers for conducting light between points or may be a mixture thereof.

In U.S. Pat. Nos. 3,674,602 and 3,674,914 there are shown and described apparatus for writing or scribing conductors, such as wires, on to the surface of an insulating base to form circuits between predetermined designated points on the insulated base or circuit board. In the apparatus of such patents, the surface of the base is provided with a heat responsive adhesive coating which, as the wire is applied to the surface, is heated, for instance ultrasonically, to activate the adhesive. The conductor is applied or scribed into the activated adhesive on the base. The adhesive is then cooled or cured to affix the wire to the base. The ends of the conductors or wires are affixed to terminals pads, or plated through holes at the ends of the conductors by soldering, welding or plating the conductor end and the terminal.

The apparatus of the '602 and '914 patents has been widely used for producing circuit boards, but is not adapted to adding circuits to existing circuit boards nor to apply circuit patterns to bases which are not provided with an adhesive surface. While, in the apparatus of the '602 and '914 patents it is possible, as the board is being produced, to change the conductor pattern before the pattern is laid down, once the pattern is laid down and the adhesive surface of the base has been activated and fixed, manual wiring is thereafter required if the circuit is to be changed or additional circuits are to be added. Thus, at each point where a new circuit is to be provided, the end of a conductor wire must be stripped, the stripped wire end must be attached, such as, by soldering, the wire must be routed and the other end stripped and soldered. This is time consuming and requires even greater time when a number of conductors are to be added. In addition to being time consuming and expensive, the board produced has a large number of loose wires which are unattractive and, more important, impair use of automatic equipment to place and attach components on the base or board. The boards to which conductors have been added are not uniform, that is, conductor length and conductor routing may vary, depending on the person doing the wiring.

In application Ser. No. 756,722, filed concurrently herewith, there is disclosed and described a process for applying conductors, such as conductors capable of transmitting electrical or light energy between conductor points, to the surface of a base or circuit board having spaced terminal points thereon which comprises adhesively bonding a conductor having an adhesive coating, such as of a thermosetting adhesive composition, to the surface of the board, by first activating, or softening the adhesive composition with, for example, heat, applying the conductor with the activated adhesive to the base and, as the conductor is applied setting, hardening or curing the adhesive coating to affix or attach the conductor to the base surface. Such process has been found to be particularly suited to adding conductors to bases or boards having existing circuit patterns to which conductors are to be added. The process is also suited for the manufacture of new circuit boards.

In application Ser. No. 756,691, also filed concurrently herewith, there is disclosed and described a process for applying a pulsed laser beam to a heat activatable adhesive, to activate the adhesive and attach or affix a conductor to the surface of a base. In such process, the laser beam pulse energy content is adjusted according to surrounding conditions and pulses are applied according to the incremental displacement of equipment scribing conductors on the surface.

SUMMARY OF INVENTION

The instant invention, is concerned with an apparatus for applying conductors to the surface of a base or a circuit board between a pair of terminals or contact points in a predetermined precise pattern and in accordance with the process of the first of the afore listed applications with a laser beam such as described in the latter of the afore listed patent applications.

In the apparatus of the invention, conductors to be adhered to the board or base surface are coated, at least on the side to be adhered, with a heat responsive adhesive, preferably with an adhesive which is capable of being thermoset. The end of the conductor is tacked or affixed to the base at the first of the contact points to be Joined. The adhesive coating on the side of the conductor to be adhesively affixed to the board or base surface is then activated, such as by heat so that the coating is adhesively active. As the adhesive coating is activated and softened, the conductor is pressed against the board surface along the path the conductor is to be applied or scribed. Such heating, pressure applying or scribing of the coated conductor to the board surface is accomplished while the conductor, such as a wire, is being fed from a dispensing head aligned with the path in which the conductor is to be applied or scribed. The dispensing head and the board are moved relative to each other along the path in which the conductor is to be applied and fixed. At the second contact point, the conductor is cut and the cut end of the conductor is fixed to the second contact point. The dispensing head and the board are then moved relative to each other to the first of the next pair of contact points to be joined, the end of the conductor is tacked or affixed to the board or base surface at the first of the next pair of contact points and the steps are repeated.

In the apparatus of the invention, the adhesive and insulation are removed from the end of the conductor where the conductor is to be fixed or attached to the contact points or terminals. This can be done at the opposite ends of the conductor or, preferably, can be accomplished by stripping the adhesive and insulation from a section of conductor to make up the end of one conductor and the start of the next conductor. The stripped section is then severing intermediate the two sections. Thus, as one conductor is completed by affixing or attaching the conductor end to the second contact point on the board or base, the leading end of the following conductor, already stripped of insulation and adhesive coating, is ready to be affixed or tacked to the first contact point of the following circuit to be formed.

The opposite ends of the conductor may be affixed or attached to the conductor points by soldering, welding or otherwise affixing the end of the conductor to the conductor point in interconnection therewith or, as is preferred where the contact point is a through hole in the board or or base, by staking the conductor end into the hole with, for example, a staker which bends or presses the wire end into the through-hole.

The board or base upon which the conductors are to be scribed can be held fixed and the dispensing head can be moved along the path in which the conductor or wire is to be scribed between contact points or, as is preferred, the dispensing head can be held fixed and the board or base can be moved along the path to be scribed. In either event, as the board or base and the dispensing head are moved relative to each other, the conductor to be affixed or attached at its ends and scribed to the surface of the board or base, is dispensed from the head. As will be described in more detail later herein, the board or base is moved along X and Y axes and, as the direction of the board movement changes, the dispensing head is rotated so as to be aligned with the axis. Apparatus for guiding and feeding the conductor, removing or stripping the adhesive and the insulation from the conductor, at the conductor ends, maintaining the required tension on the conductor as it is being scribed without stretching, extending or elongating the conductor and for cutting or severing the conductor are all incorporated in the dispensing head.

In the apparatus of the invention, as will be described, the adhesive coating on the conductor at the side of the conductor to be scribed and affixed to the base, is heated and activated with a laser beam, such as from a $CO_2$ laser, just before the conductor is brought into contact with the board. The laser beam is focused on the adhesive coated wire with lenses and mirrors in the dispensing head. The laser beam is deflected in the dispensing head with a movable mirror to a stripping chamber where, with the aid of an air blast and a vacuum, the laser beam is used to strip the adhesive and insulation from the conductor at the ends to be affixed or attached at the conductor points on the board before the conductor is dispensed.

The apparatus of the instant invention can be employed to add a single circuit pattern to a board, a plurality of circuit patterns to a board or to add identical circuit patterns to a plurality of boards. In the instance of adding identical circuit patterns to a plurality of boards, the boards or bases are provided with indexing holes which are matched with indexing pins on a base and the base and dispensing head are pre-programmed to follow a pre-set sequence in selecting the pairs of contact points to be joined and in applying and fixing the conductors or wires to the board.

The dispensing head support, in the apparatus of the invention, in addition to supporting the dispensing head at one side of the spindle axis, supports, at the other side of the axis and in alignment with the dispensing head, an indexer having mounted thereon a pressure wheel, a tacker and a staker. The indexer is rotatable to, in one radial position, position the staker and tacker at one side of the spindle axis opposite to the dispensing head and, in the other radial position, to position the pressure wheel adjacent the spindle axis and opposite to the dispensing head.

The invention of the instant application will be more fully described and will be better understood from the following description taken with the appended drawings, in which FIG. 1 is a perspective view of the apparatus of the instant invention;

FIGS. 21(a) to (m) are schematic views showing various steps in the operation of the apparatus of the instant invention.

Figure 1:
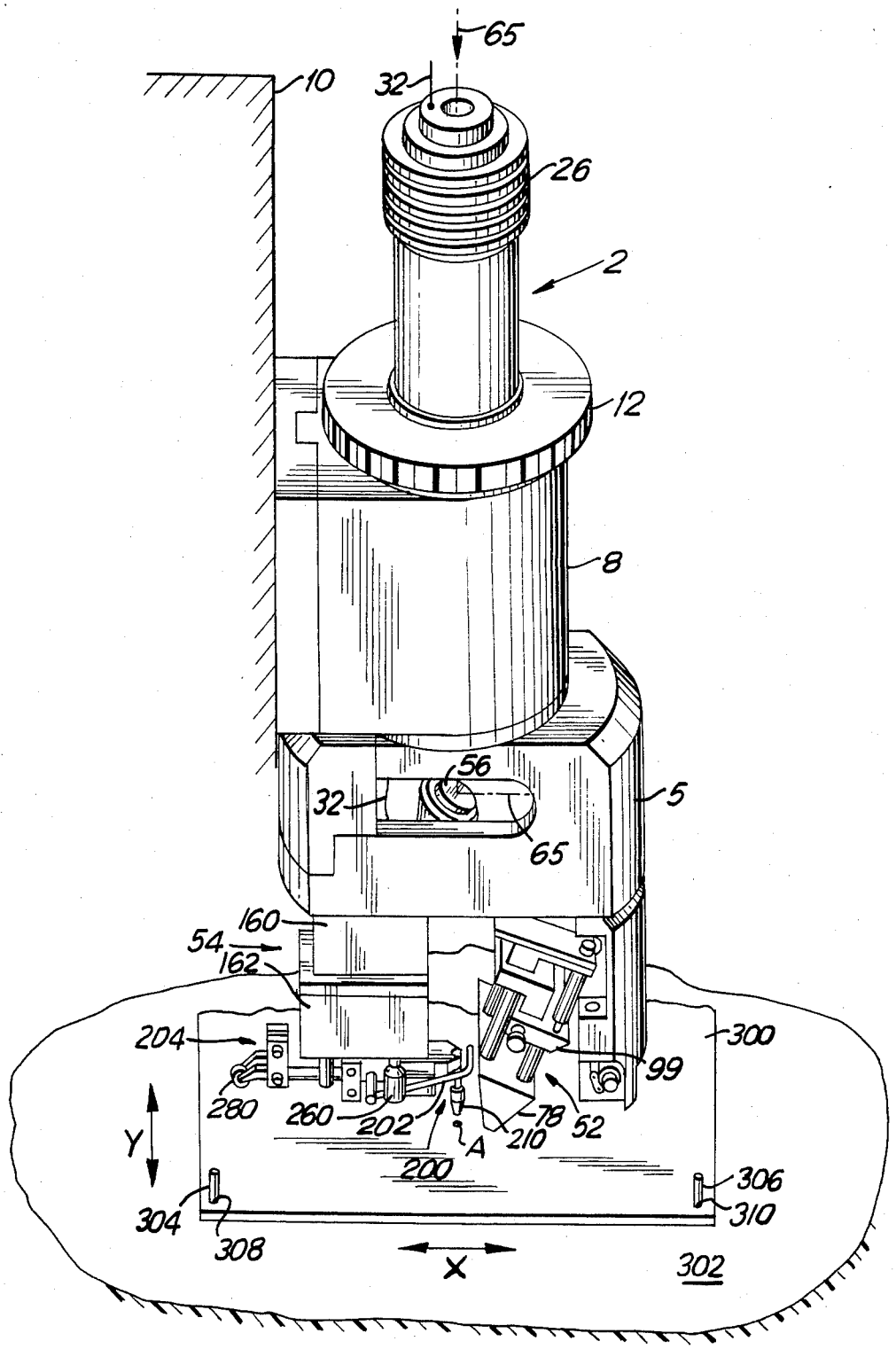
Figure 2:
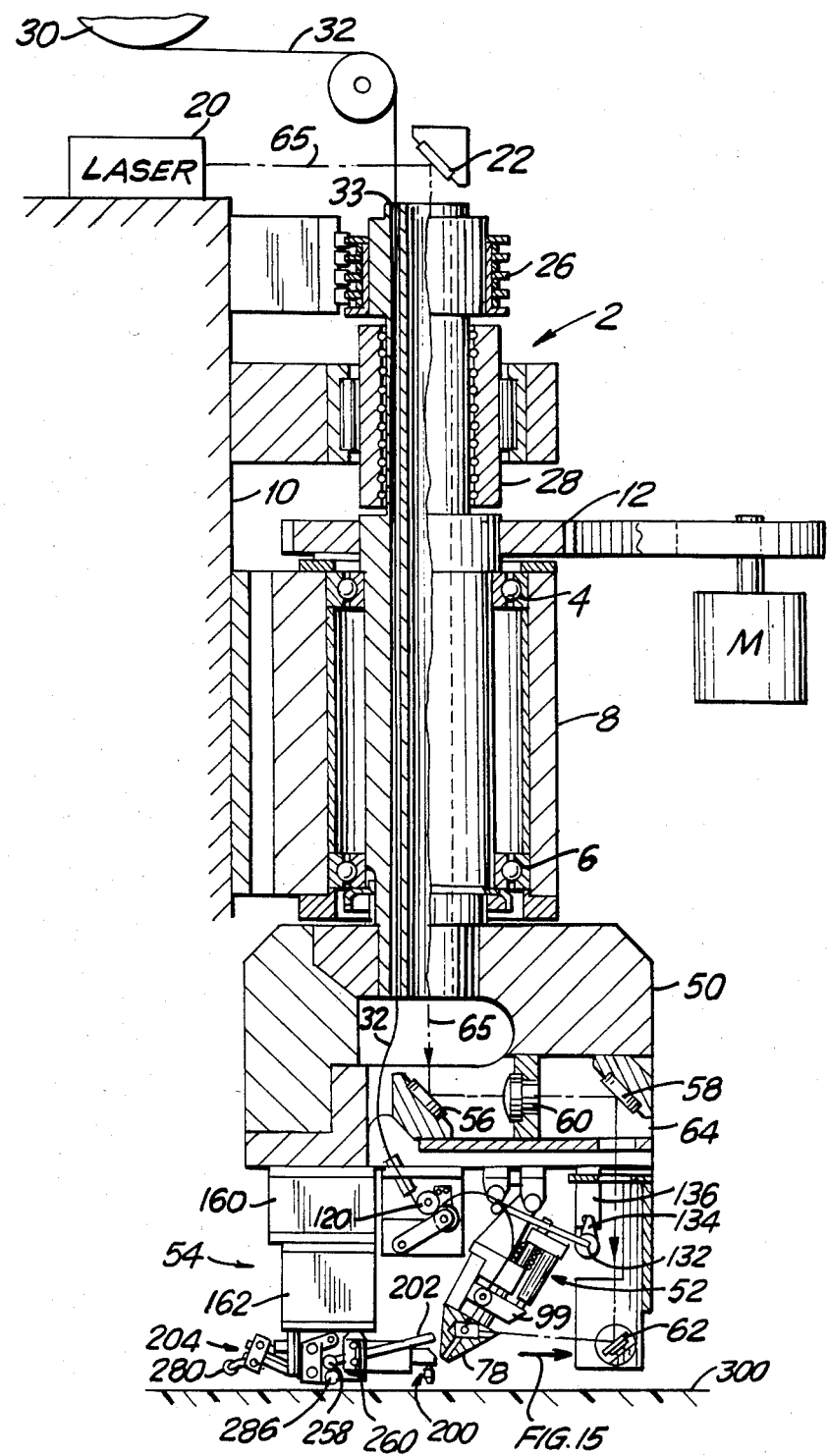
FIG. 2 is a side elevation view, partially in section, of the apparatus of FIG. 1.
Figure 3:
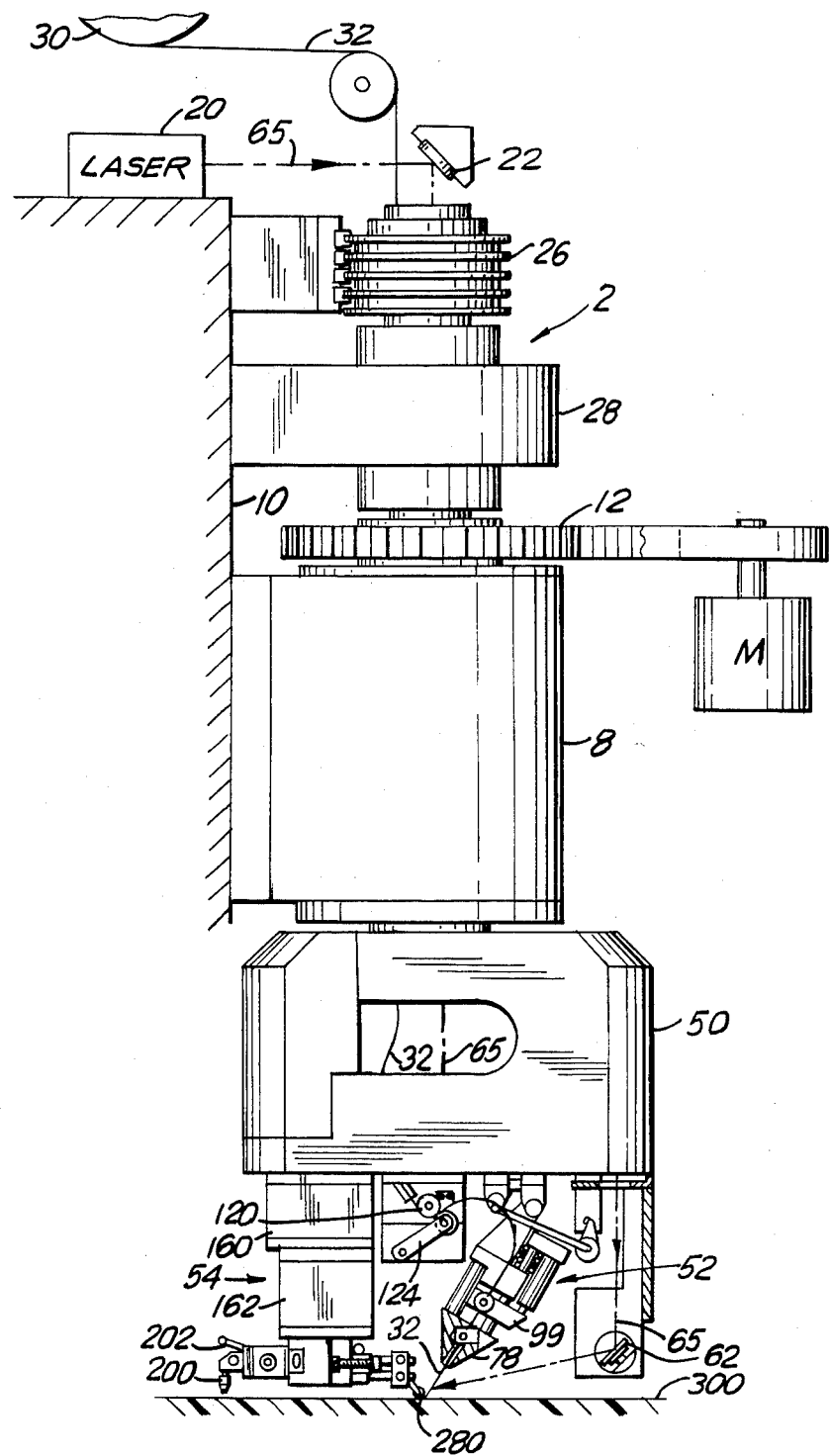
FIG. 3 is a view similar to FIG. 2 but showing the apparatus in a different position.

Referring to the drawings, especially FIGS. 1, 2 and 3, the apparatus of the instant invention includes a tubular hollow spindle, generally designated 2, supported for rotation by bearings 4, 6, in housing 8, fixed to machine base 10. Gear 12 is fixed to spindle 2 for rotating spindel 2 about its axis for purposes hereinafter described.

As best shown in FIGS. 2 and 3, laser beam generator 20 and mirror 22 are mounted on base 10 above the upper end of spindle 2, the laser beam from generator 20 being reflected by mirror 22 downward through hollow spindle 2, along the spindle axis, as spindle 2 is rotated relative to base 10, as will be hereinafter described. Slip-ring 26 and pneumatic manifold 28 are fixed to spindle 2 above gear 12 for connecting the various units, as will hereinafter be described, to electric and pneumatic power sources, respectively. Conductor supply reel 30 is mounted above spindle 2 for supplying conductor 32 to conduit 33 in spindle 2 for purposes later described.

Figure 4:
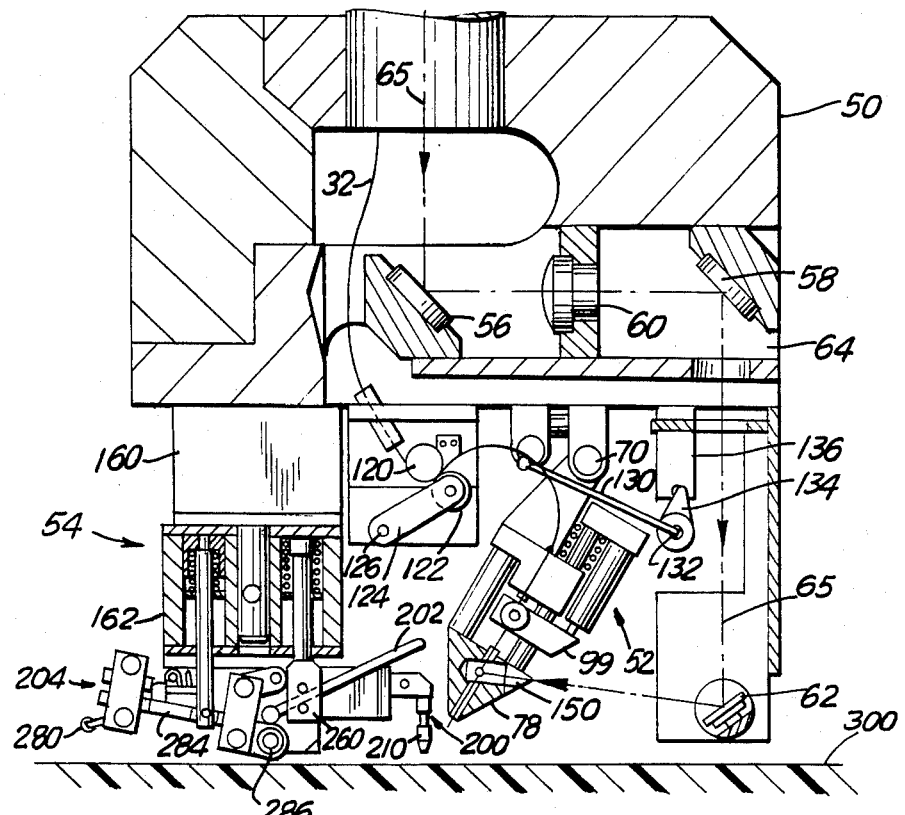
FIG. 4 is an enlarged view of a portion of the apparatus of FIG. 2.

Referring to FIGS. 2-6, feeder head base 50 is fixed to the lower end of spindle 2 and supports, at positions diametrically opposed at the opposite sides of the spindle axis, conductor feed guide, generally designated 52, and indexer, generally designated 54. Laser beam mirrors 56 and 58, and laser beam lens 60, FIG. 4, are optically aligned in tubular passage way 64 in feeder head base 50 for receiving laser beam 65 from generator 20, reflected by mirror 22 and for reflecting and transmitting the laser beam to pivotally mounted mirror 62 for purposes later described.

Figure 6:
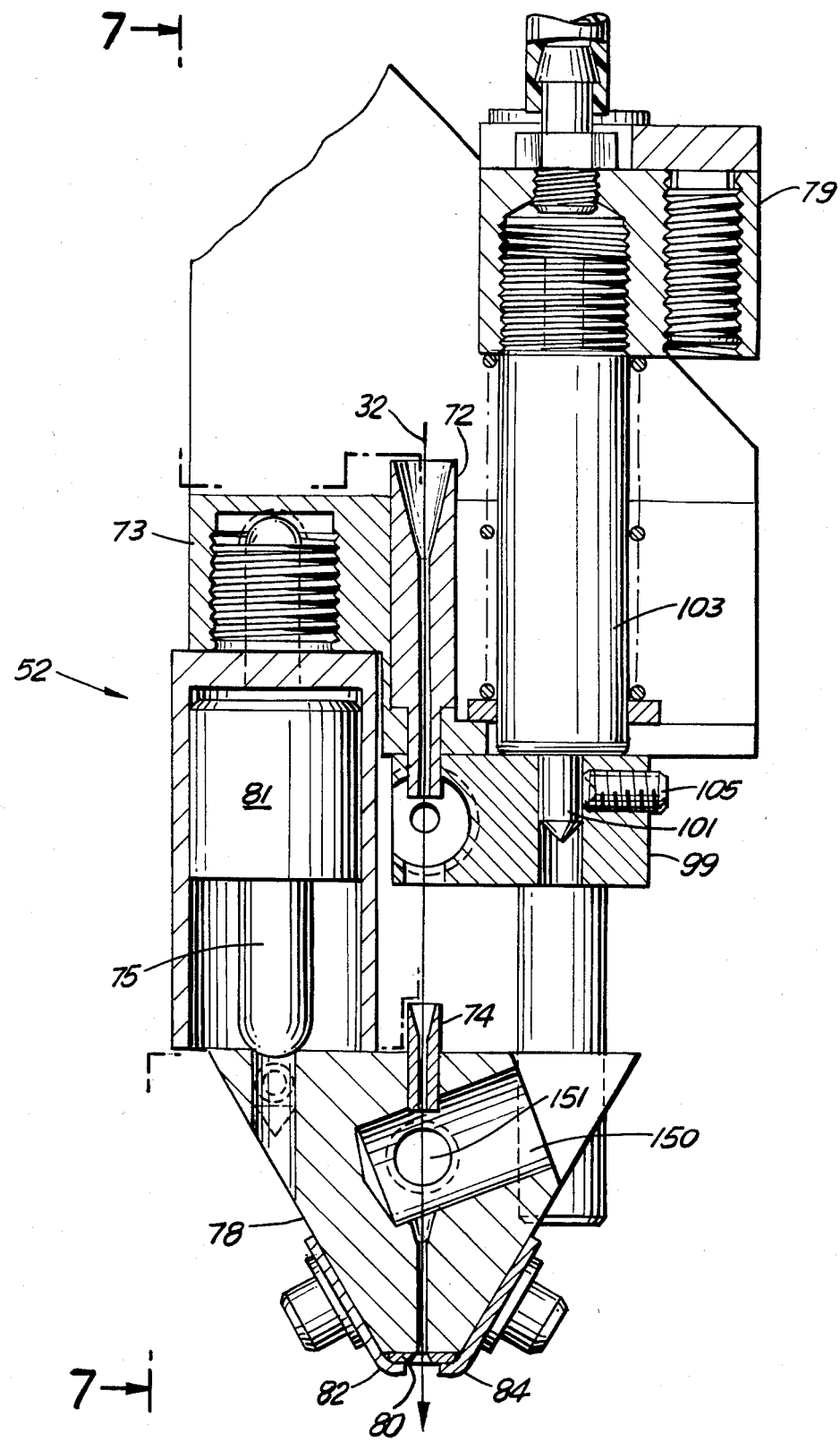
FIG. 6 is a further enlarged sectional view of the dispensing head of FIGS. 4 and 5.
Figure 7:
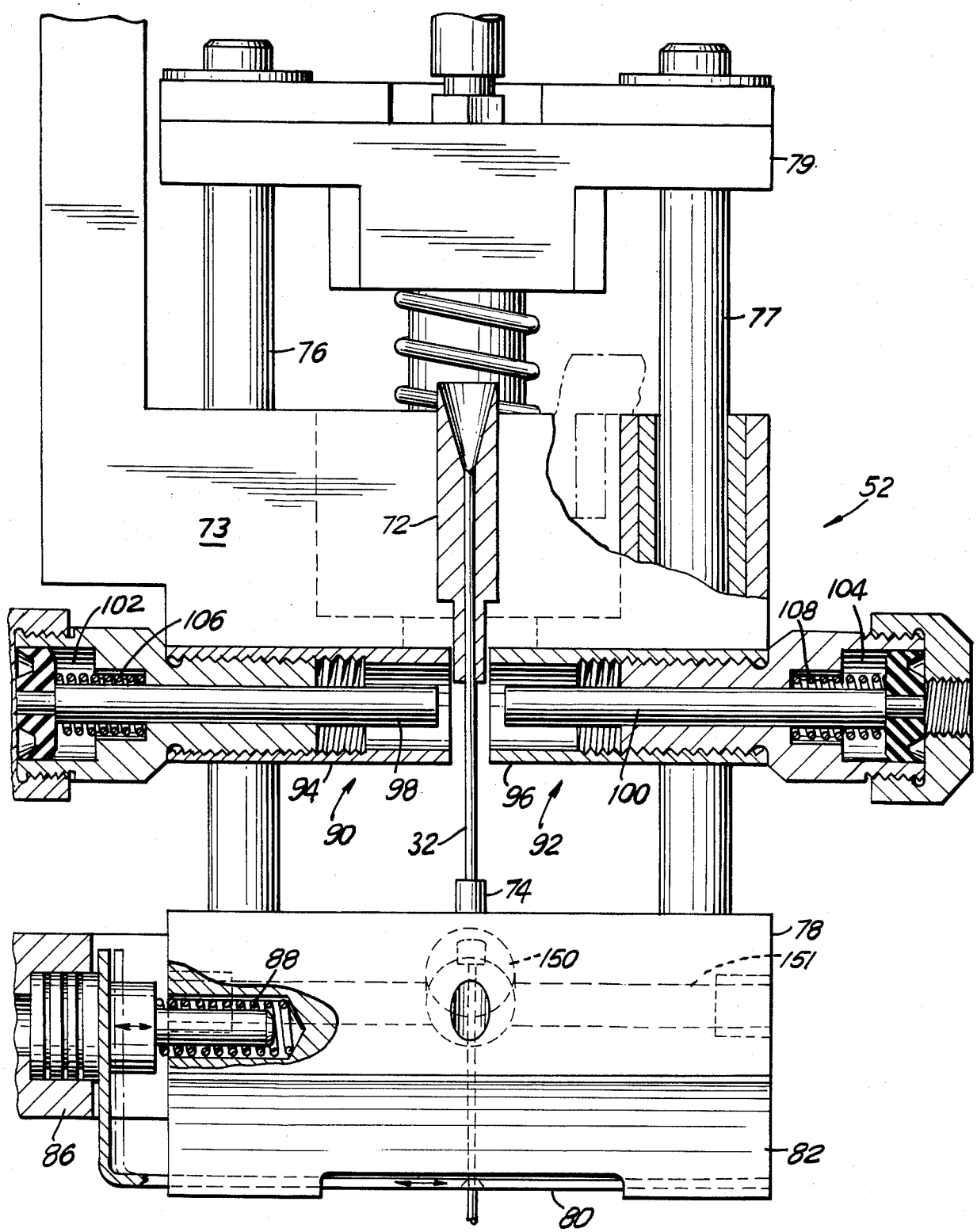
FIG. 7 is a view taken at 7—7, FIG. 6.

Conductor feed guide 52 is mounted, at 70, and, as best shown in FIGS. 6 and 7, includes an upper fixed conductor guide 72, in fixed base 73, and a lower movable conductor guide 74, in lower movable guide head 78, fixed to the end of guide rods 76, 77, FIG. 7, slidable in base 73 and mounted at their upper ends in head 79. As best shown in FIG. 6, piston rod 75 of air cylinder 81 mounted in fixed base 73 is attached to guide head 78 for advancing and retracting lower movable conductor guide head 78 away from and back toward upper guide housing 73 for purposes later described. Knife blade 80, FIG. 6, is slidably mounted on the end of guide housing 78 between supports 82, 84 for sliding movement therebetween by air cylinder 86 attached to the end of the blade, FIG. 7, to sever the conductor, as will be later described, and for return by compression spring 88.

As best shown in FIG. 7, conductor grippers, generally designated 90, 92, having housings 94, 96, formed in gripper block 99 and conductor grippers 98, 100, are mounted at the opposite sides of conductor 32 between upper guide housing 73 and lower guide housing 78. At their outer ends, grippers 98, 100 are connected, respectively, to air cylinders 102, 104, for gripping engagement with the conductor and for return by compression springs 106, 108. As best shown in FIG. 6, gripper block 99 is fixed to piston rod 101 of air cylinder 103 by set screw 105 for advancing and retracting conductor grippers 98, 100, relative to head 78 for reasons more apparent later herein.

Referring to FIGS. 2, 3, 4 and 5, conductor 32 is fed to feed guide 52 by capstan 120, driven, as hereinafter explained, by a variable speed motor, conductor 32 being held in driving engagement with capstan 120 by pinch roller 122 mounted for rotation on arm 124, pivoted at 126 and spring urged toward capstan 120 to grip conductor 32 therebetween. Conductor feed loop controller 130, with its free end in the loop path of the conductor, for reasons later described, is pivotally mounted at 132 for rotating cam 134 into and out of the beam of photon-coupled interrupter 136 to regulate the speed and feed of conductor 32 by capstan 120. Conductor 32 is fed by capstan 120 to upper and lower guides 72, 74 and is withdrawn from feed head 52 as the conductor is applied and fixed to the surface of the base, as will be described. As withdrawal of the conductor from feed head 52 is increased and the size of the conductor loop decreases, loop controller 130 pivots counterclockwise around pivot 132 to increase the speed of the variable speed capstan motor. The feed of the conductor thereby increasing the size of the conductor loop. As the conductor loop increases in size, loop controller 130 is pivoted clockwise around pivot 132 to decrease the speed of the variable speed capstan motor. The feed of the conductor thereby is decreased, decreasing the size of the conductor loop.

As best shown in FIGS. 2-6, lower conductor guide housing 78 includes a recessed opening 150 which, at its inner end bisects the path of conductor feed and exposes conductor 32 in housing 78 to the laser beam of generator 20, reflected and guided by mirrors 22, 56, 58 and 62, when mirror 62 is so tilted, into opening 150 as shown in FIG. 4. Thus, as will be more fully described later herein, with mirror 62 in one position (FIG. 5), the adhesive coating on the conductor is activated by laser beam 65 in order to apply and affix the conductor to the surface of the base and, with mirror 62 in the tilted position (FIG. 4), laser beam 65 is deflected into opening 150 to remove or strip the adhesive and insulator coatings from the conductor. Recessed opening 150 is provided with a vacuum opening to apply a vaccum and remove residue as the coatings are removed or stripped and an air opening to apply an air blast to the area to assist in the removal of residue from the stripped wire and the recess.

Figure 5:
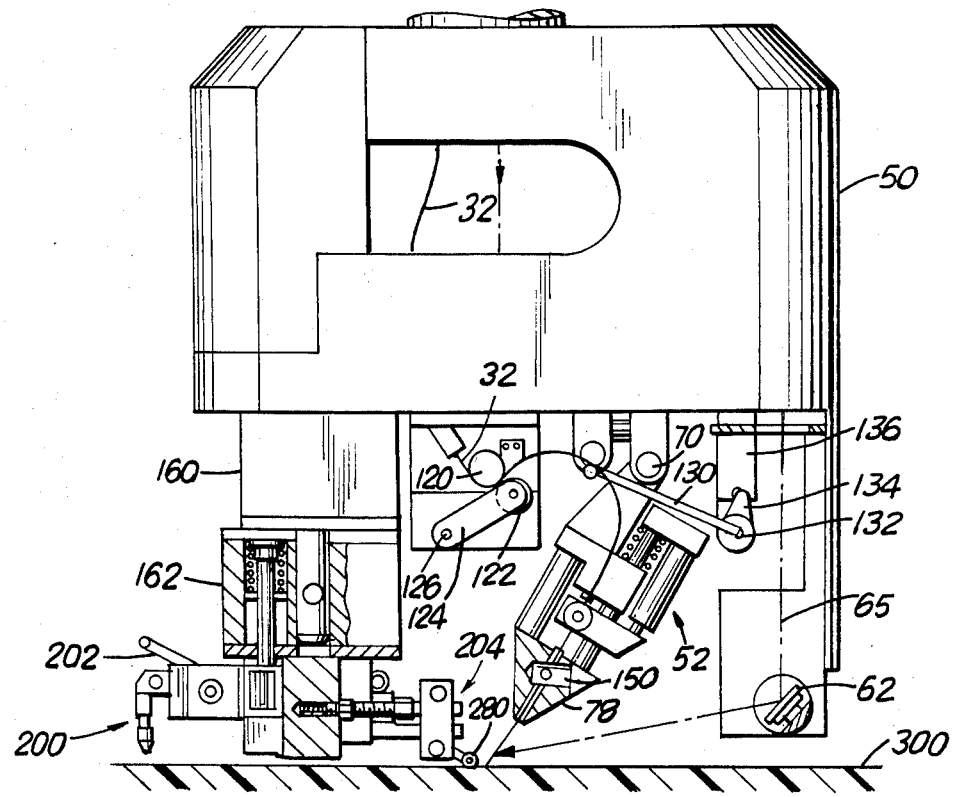
FIG. 5 is an enlarged view of a portion of the apparatus of FIG. 3.
Figure 16:
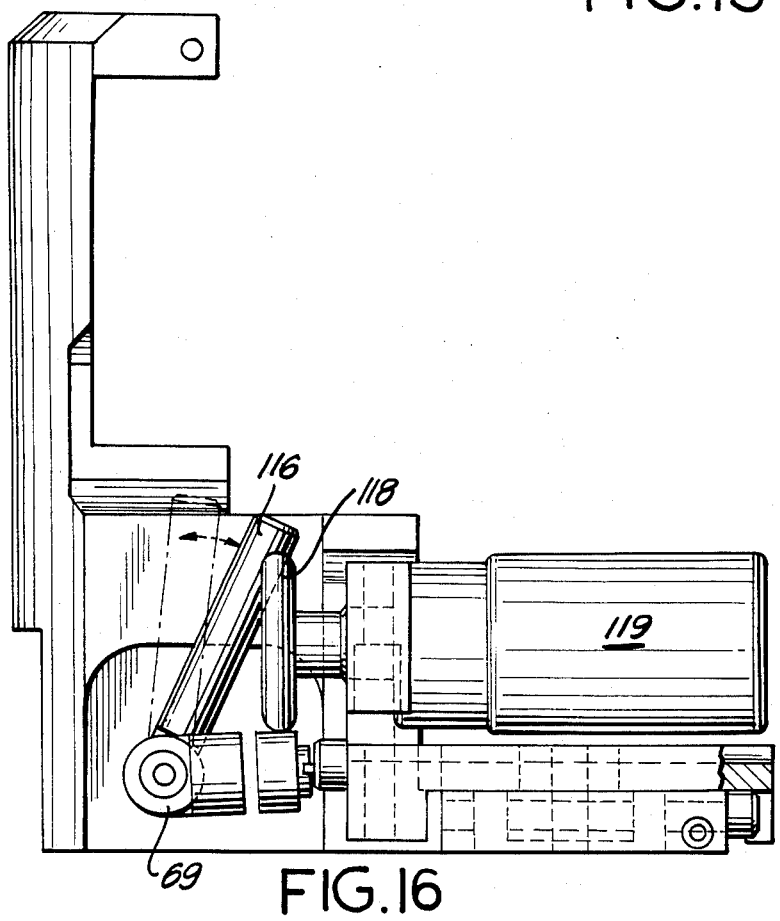
FIG. 16 is a view of the lower laser mirror, taken from the left, FIG. 15.
Figure 17:
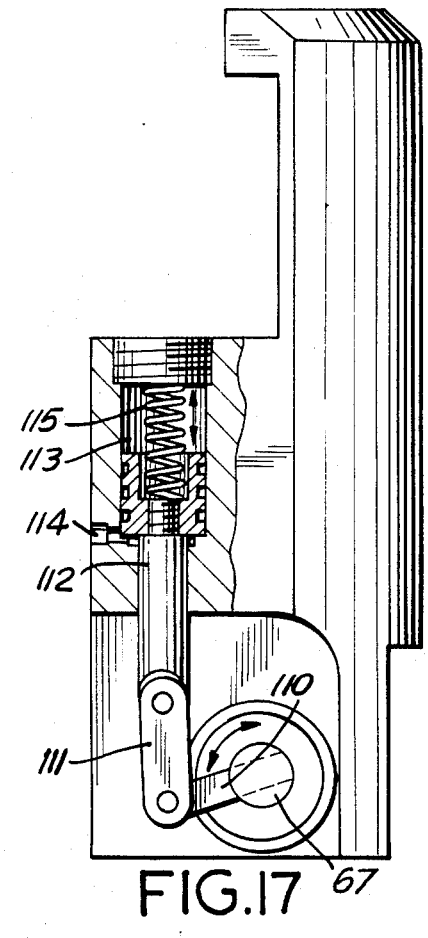
FIG. 17 is a view of the apparatus of FIG. 16 but taken from the right, FIG. 15.

Referring to FIGS. 5, 16 and 17, mounting 63 of mirror 62 is mounted for rotation on shafts 67, 69. As best shown in FIG. 17, shaft 67 is connected by arms 110, 111 to piston rod 112 of cylinder 113 activated by compressed air through port 114 to rotate the mirror in one direction and by spring 115 in cylinder 113 to rotate the mirror in the other direction. When rotated in the direction to reflect the laser beam against the conductor to activate the adhesive coating, FIGS. 3 and 5, arm 116 on mirror shaft 69, FIG. 16, is held against a fixed stop. When rotated in the opposite direction to reflect the laser beam into opening 150 to remove or strip the adhesive coating and insulation from the conductor, arm 116 on mirror shaft 69 engages cam 118 driven by motor 119 to cause mirror 62 to oscillate. Thus, when the laser beam is reflected into opening 150 to remove or strip the adhesive coating and insulation from the conductor the beam scans or sweeps a conductor length, thereby removing or stripping the coating and insulation from the scanned or swept length.

Figure 8:
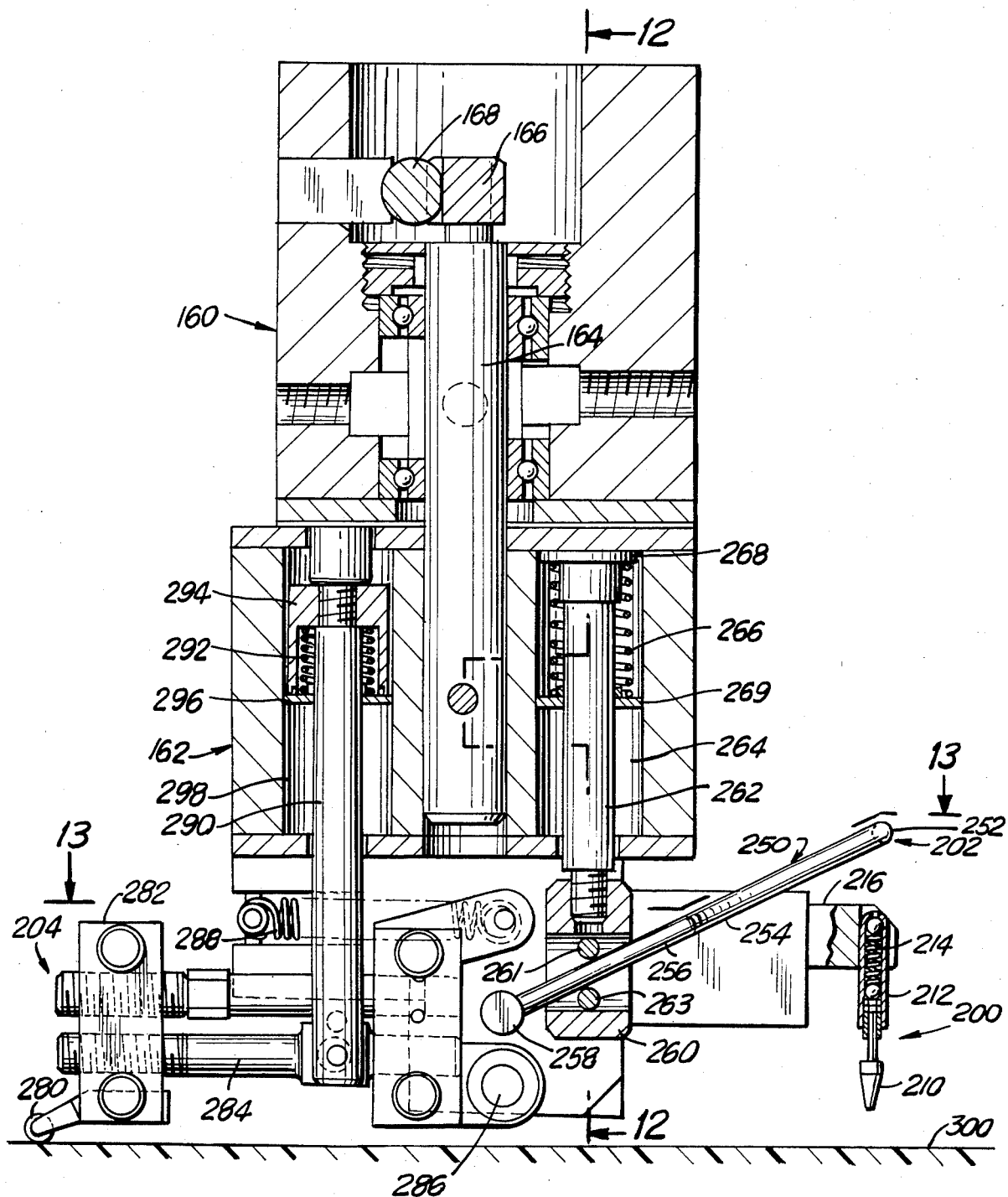
FIG. 8 is an enlarged view, partly in section, of the indexer.
Figure 11:
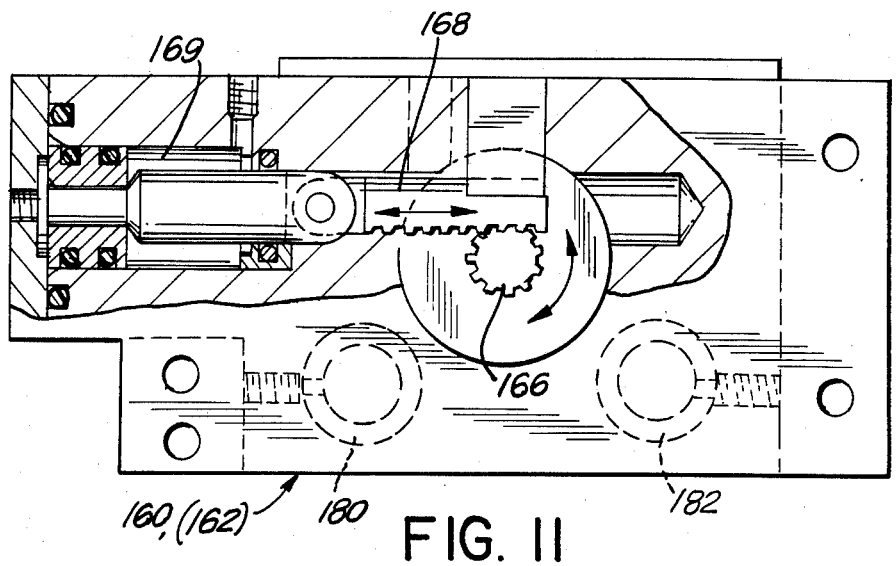
FIG. 11 is a view, partly in section, taken from the top of the indexer base, FIG. 8, and showing the apparatus for rotating the indexer.

Referring, now, to FIGS. 2, 3, 4, 5, 8, 11 and 12, indexer 54 includes a base 160 mounted in fixed position on feeder head base 50 and an indexing head 162 mounted on shaft 164 (FIGS. 8 and 11) for 180 Degree rotation on indexer base 160. As best shown in FIGS. 8 and 11, at its upper end in fixed base 160, shaft 164 is keyed to pinion 166 in engagement with rack 168 connected to the piston rod of two way air cylinder 169. When air cylinder 169, rack 168 and pinion 166 are in one position the indexer head 162 is positioned, as will be described, for staking and tacking the conductor. When air cylinder 169 is actuated to turn rack 168 and pinion 166 in the opposite position, indexing head 162 is rotated 180 Degrees and the pressure wheel is in operating position to apply, fix and scribe the conductor to the base or board surface.

Figure 12:
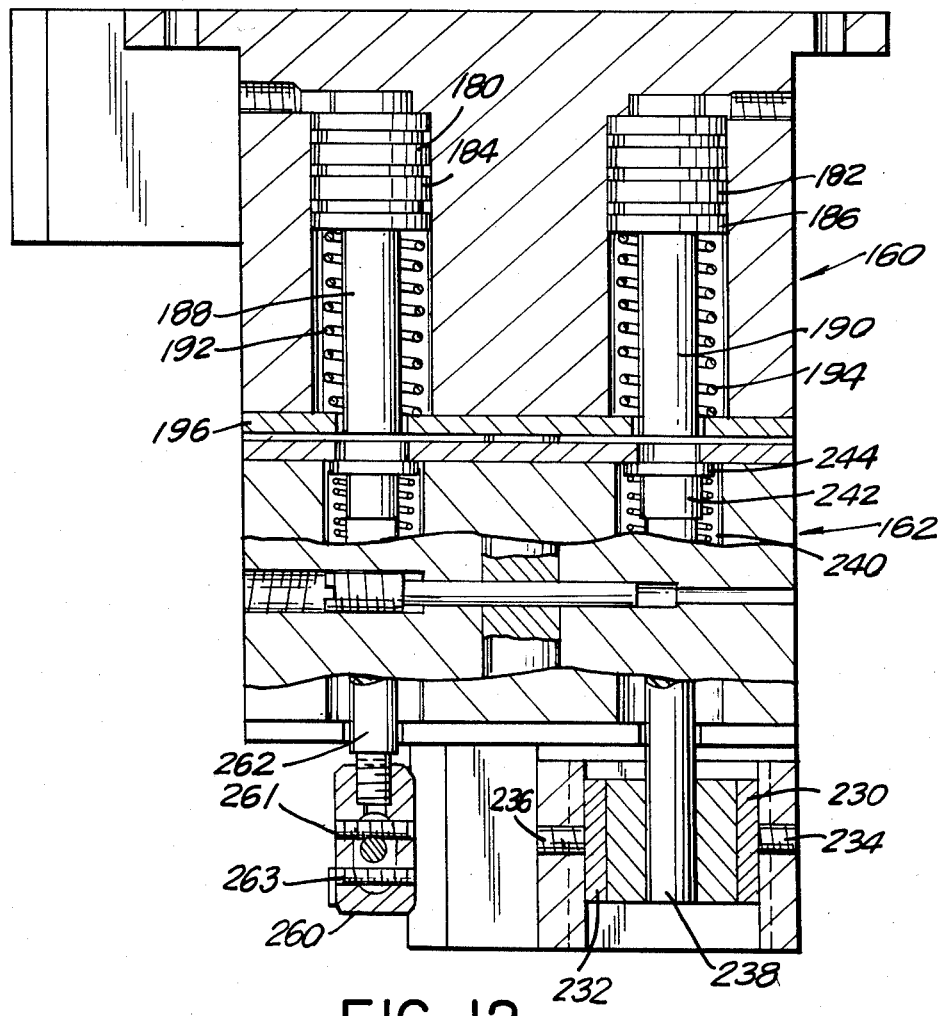
FIG. 12 is a sectional view of the indexer taken at 12—12, FIG. 8.

As best shown in FIGS. 11 and 12 and for reasons more apparent later herein, fixed indexer base 160 further includes air cylinders 180, 182, having, respectively, pistons 184, 186 and piston rods 188, 190. Pistons 184, 186 are held upward in cylinders 180, 182, by compression springs 192, 194 between the respective pistons and indexer base plate 196, with piston rods 188, 190 retracted. When the air cylinders 180 and 190 are actuated, as the case maybe and as will be described, spring 192 or 194 is compressed and piston rod 188, 190 is pushed into engagement to actuate the staker, tacker or pressure wheel, as will be described.

Figure 9:
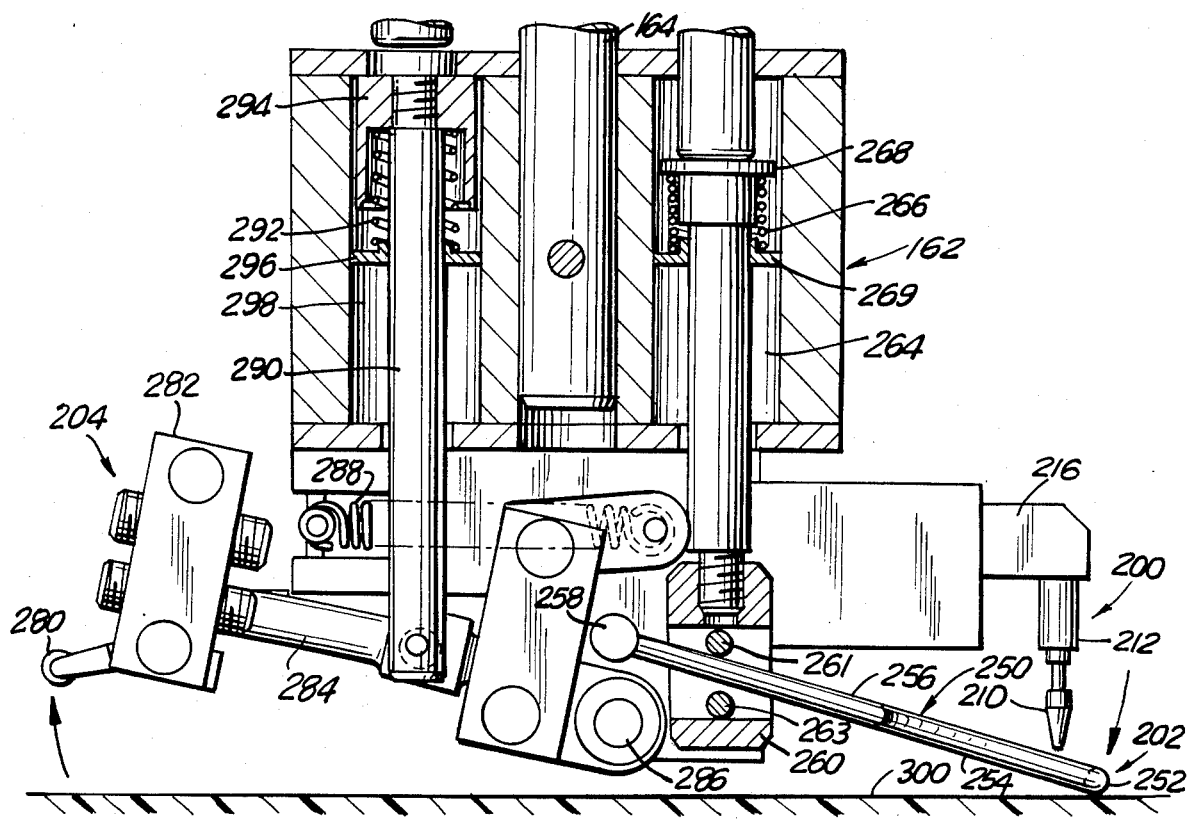
FIG. 9 is an enlarged view, partly in section, of the indexer showing the tacker in engaged position.
Figure 10:
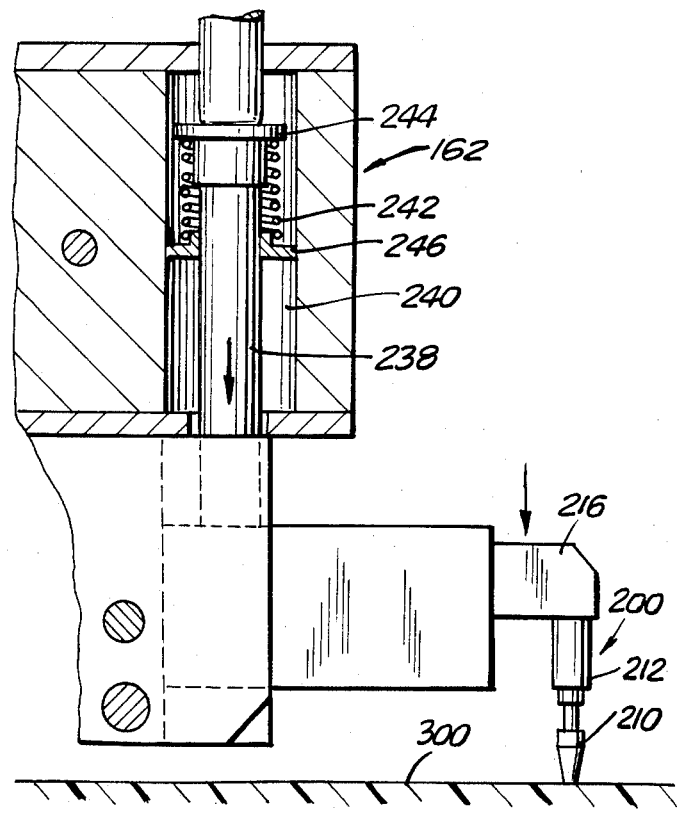
FIG. 10 is an enlarged view similar to FIG. 9 but showing the staker in engaged position.

Referring to FIGS. 8, 9 and 10, the staker, generally designated 200, the tacker, generally designated 202, and the pressure wheel, generally designated 204, are all mounted on indexer head 162. As best shown in FIG. 8, staker 200 has a tapered headed pin 210 slidably mounted for vertical movement in sleeve 212 and urged outwardly therein by spring 214. Sleeve 212 is mounted in mounting block 216 and is clamped therein by set screw 218, FIGS. 13 and 14. Mounting block 216 is slidably positioned in block 220 and is adjusted therein by mating cam surfaces 222, 224 adjusted by set screw 226 and held in mating engagement by compression spring 228. Block 220, FIGS. 12 and 13, is mounted by plates 230, 232 and set screws 234, 236 on the end of staker actuator rod 238 in cylindrical bore 240 in indexer head 162 and held retracted therein, FIG. 12, by compression spring 242 between rod head 244 and stop 246 fixed in opening 240.

Figure 13:
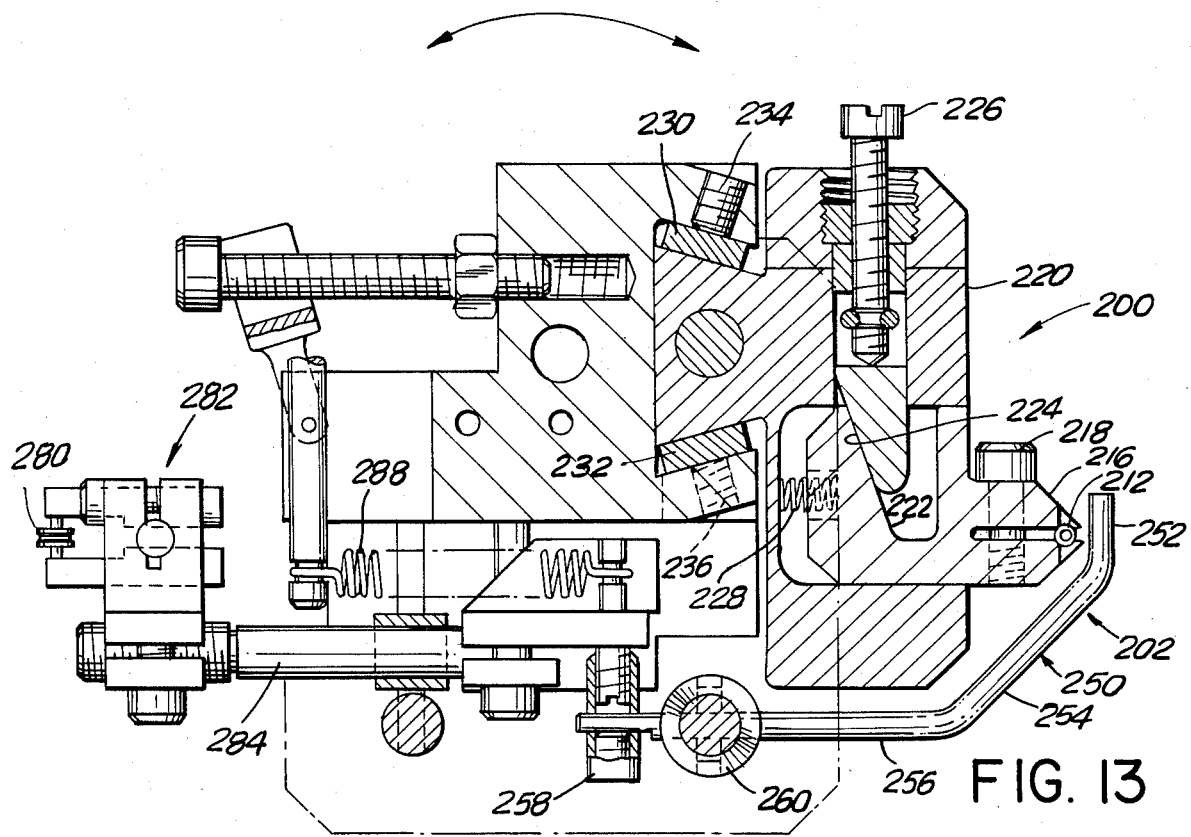
FIG. 13 is a sectional view taken at 13—13, FIG. 8.
Figure 14:
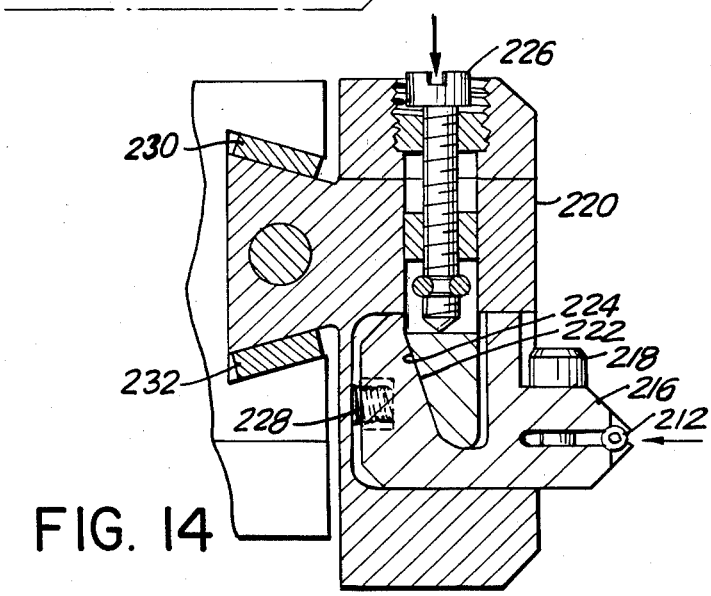
FIG. 14 is a partial view of the apparatus of FIG. 13 showing a further position of the adjustment.

Tacker 202, FIGS. 8, 9 and 13, has a rod 250 having a forward end 252 which, as will be apparent form the description which follows, contacts the conductor for tacking, an angular portion 254 and a rearward extending portion 256 by which it is pivoted, at 258. Adjacent its pivoted end, FIG. 8, rearward portion 256 passes through collar 260 adjustably fixed to the end of tacker actuato rod 262 which extends upward into cylindrical bore 264 in indexer head 162 and is held retracted therein, FIG. 8, by compression spring 266 between rod head 268 and stop 269 fixed in opening 264. At the opposite sides of tacker rod portion 256, collar 260 is provided with pins 261 and 263 which, as actuator rod is moved up and down, as herein later described, raises and lowers the forward end 252 by pivoting rod 250 on pivot 258.

Figure 18:
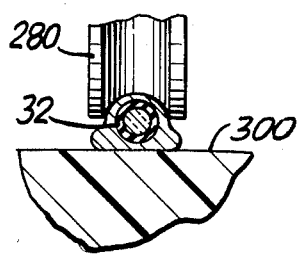
FIG. 18 is an enlarged view, partly in section, showing a conductor being applied to a base or board surface in accordance with the invention.
Figure 19:
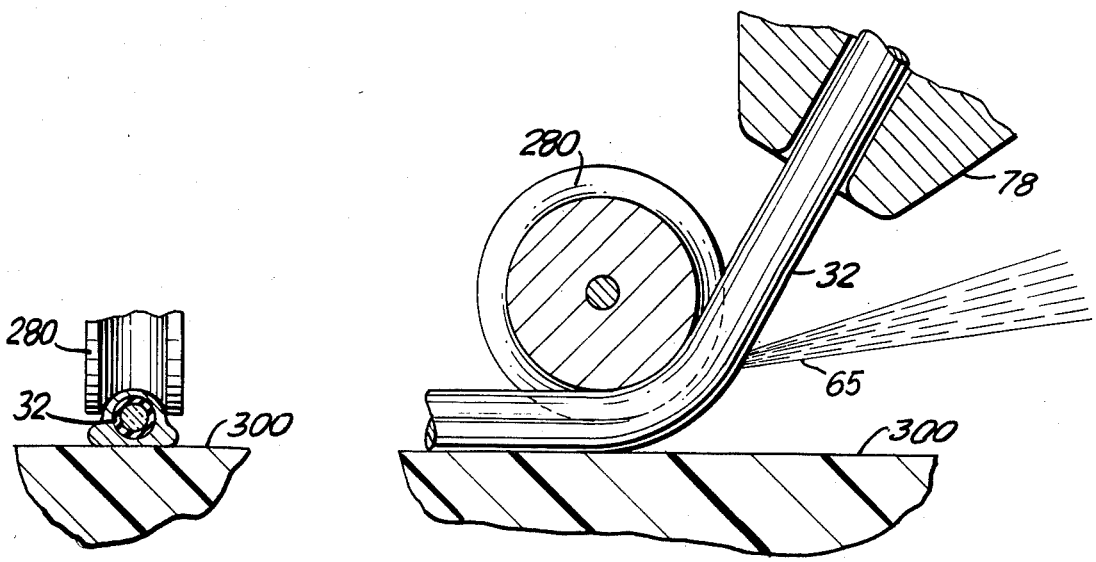
FIG. 19 is an enlarged view, partly in section, showing a conductor being applied with the laser beam striking the conductor to activate the adhesive just prior to contact of the conductor with the base surface.
Figure 20:
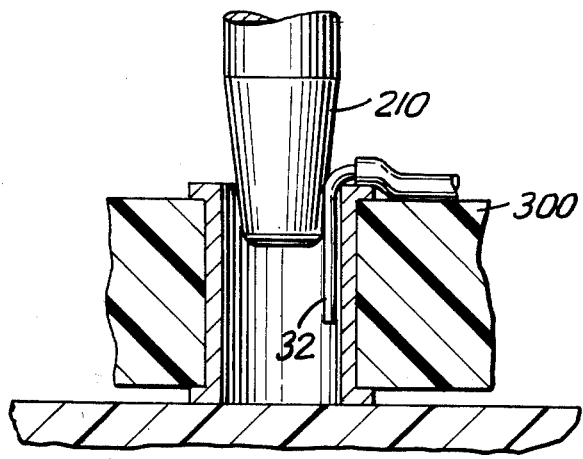
FIG. 20 is an enlarged sectional view of the staking operation.

Pressure wheel 204, FIGS. 8, 9 and 13, includes wheel 280, suitably grooved to receive the coated conductor and press the conductor against the board surface, FIGS. 18 and 19, mounted by an adjustment mechanism, generally designated 282, on rod 284 pivoted, at 286, and spring urged, by adjustable tension spring 288, into engagement with the conductor when wheel 280 is engaged. Intermediate pivot 286 and the end carrying wheel 280 and adjustment mechanism 282, rod 284 is connected to the end of wheel actuator rod 290 urged upward in indexer 162 by compression spring 292 between actuator rod head 294 and stop 296 fixed in cylindrical bore 298 of indexer 162. Air cylinder 182 in indexer base 160, when indexer head 162 is rotated to position pressure wheel 280 in operating position, is aligned with the stop end 296 of wheel actuates rod 290 and, when compressed air is applied to cylinder 182, pushes rod 290 downward to engage wheel 280 with the board surface. When air is exhausted from cylinder 182, rod 190 is lifted or retracted by compression spring 194 and wheel 280 is lifted or retracted by compression spring 292. Similarly, when indexer head 162 is rotated on indexer base 160 to bring staker 200 and tacker 202 into operating position, air pressure is first applied to cylinder 182 to actuated staker 200 and, while staker 200 is actuated, is applied to cylinder 180 to actuate tacker 202. When tacking is completed, air is exhausted from both cylinders.

The apparatus of the instant invention is adapted to apply and affix, or scribe, one or more conductors to the surface of a circuit board, each conductor being applied, or scribed along a predetermined path and between a predetermined pair of conductor points. Preferably, the table upon which the board or base is to be fixed for applying the conductor or conductors and the spindle, or head, are connected to and controlled by a computer programmed to locate the conductor points, or terminals, to be connected on the board, the path to be followed, the directions the table is to be moved and the direction the spindle or head is to be oriented and the other parameters, such as, turning the laser on and off, tipping mirror 62, etc., necessary to effect proper operation and the desired connections. Thus, as is often the case, a plurality of boards, one after the other, are mounted on the table and the conductor program is repeated.

With the apparatus programmed, board 300, FIG. 1, is mounted on table 302 and is located thereon by location pins 304, 306, fixed to table 302 and passing upwardly through location, or indexing holes 308, 310 in the board. By the pre-program, board 300, table 302 and spindle 2 are in position relative to conductor point or terminal A to start the application, with the feeder head facing in the required direction for table and board travel. The laser beam is energized, while the conductor is being applied or scribed by pulsing the beam in accordance with the latter of the above mentioned applications. The laser is programmed to operate (1) while the conductor is being applied or scribed and the board is being moved, and (2) just before the staked conductor is to be tacked and while adhesive and insulation are being removed or stripped from the conductor. When movement of the board is stopped, such as for change of conductor direction, change of conductors, etc., the laser is turned off and reenergized when movement of the board or laser operation is resumed. During scribing operations the laser is preferably pulsed according to incremental movements.

To commence the operation, assuming the conductor end in the wire guide head is suitably stripped of adhesive and insulation and is ready for application, air cylinders 102, 104 of conductor grippers 90, 92 are actuated to bring grippers 98, 100 into gripping engagement with the conductor and, with the conductor so gripped, compressed air is introduced into air cylinder 81 to advance conductor guide block 78 and conductor 32 therein toward the first of the pair of contact points or terminals to be connected. With guide block 78 fully advanced, air cylinders 102, 104 still actuated and grippers 98, 100 still gripping conductor 32, compressed air is introduced into air cylinder 103 to advance gripper block 99 and grippers 98, 100, with conductor 32 gripped therebetween, toward conductor guide block 78 being held advanced by the compressed air in cylinder 81. Thus, the stripped end of conductor 32 is advanced outwardly through the advanced end of conductor guide block 78 and over the hole or first of the terminal points to be joined or connected. Staker 200 is actuated by introducingg compressed air into air cylinder 182 and the stripped end of conductor 32 is staked into the terminal point. With the stripped end of conductor 32 staked and staker head pin 210 in the hole with the staked conductor end, com air is introduced into air cylinder 180 to bring tacker 202 down against conductor 32 next to the staked terminal A. As tacker 202 is being brought down, laser beam 65 is pulsed against the adhesive coating on conductor 32 to adhesively activate the coating and the conductor, adjacent the staked terminal A, is affixed to the board surface. With the leading end of the conductor staked to the terminal and tacked to the board surface, staker 200 and tacker 202 are lifted by releasing compressed air from cylinders 180, 182, indexing head 162 is rotated 180 Degrees on indexer head 160 to bring pressure wheel 280 into alignment with the conductor to be scribed, cylinder 182 is activated to bring pressure wheel 280 down into pressure contact with the conductor to be scribed and, as this is being accomplished, laser beam 65 is energized and pulsed to activate the adhesive on the conductor just ahead of the point where the conductor will be brought into pressure contact with the board surface by pressure wheel 280. At the same time, table 302 is advance to move board 300 relative to conductor guide block 78 along the X axis, the Y axis or along a combination of the X axis and Y axis.

Figure 15:
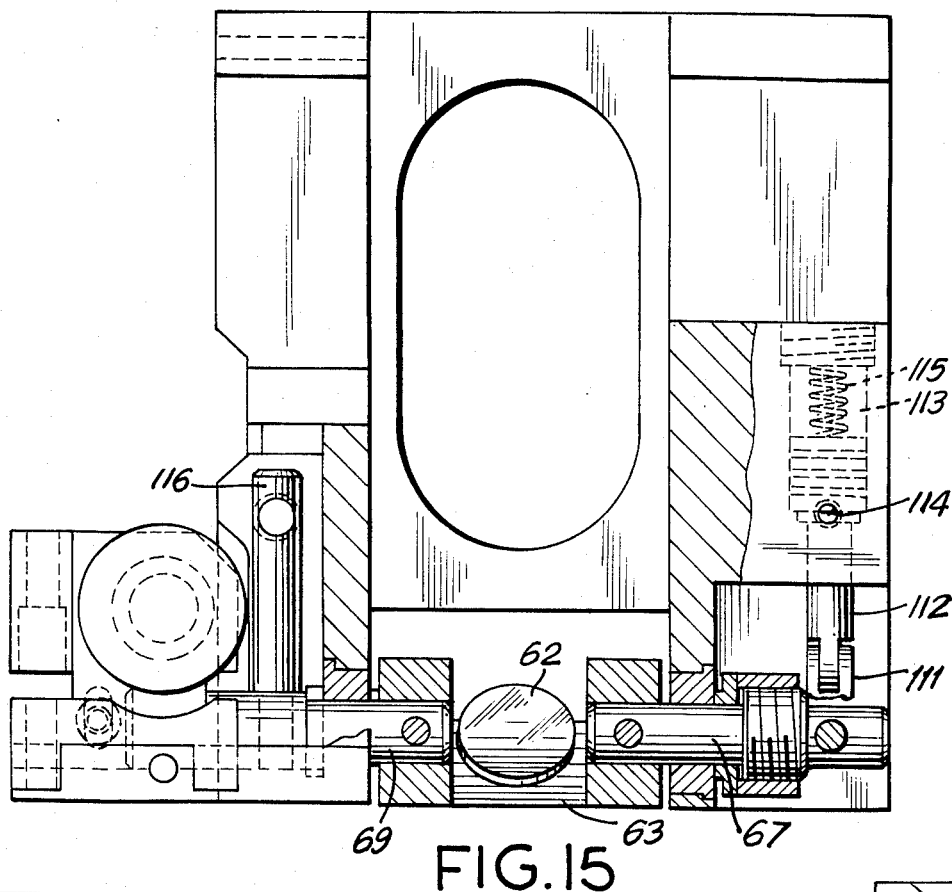
FIG. 15 is an enlarged view, taken in the direction of the arrow, FIG. 2, of the lower laser mirror.

Before the board reaches the second of the terminals being connected and at a pre-programmed distance so that, when is resumed, the second terminal will be reached and not passed, movement of the board is stopped, air cylinder 81 is activated to bring conductor block 78 down toward the board surface and mirror 62 is deflected by air cylinder 113, FIGS. 15–17, so that arm 116 contacts cam 118 driven by motor 119. Thus, mirror 62 is tilted back and forth, (FIG. 21[i]), in the directions of the arrows, to sweep along a section of the conductor to be stripped of adhesive coating and insulation. With laser beam generator 20 activated and laser beam 65 suitably pulsed, the adhesive coating and insulation are vaporized off of the conductor, the residue being removed by a vacuum applied to recess 150 through port 151, FIG. 6. An air jet, at the end of the removal may also be employed.

When the coating and insulation have been vaporized and removed, i.e. after a pre-programmed time interval, compressed air in cylinder 113 is released and spring 115, FIG. 17, returns the mirror to its downward position. With laser generator 20 again activated and laser beam 65 suitably pulsed and reflected against the coating on conductor 32 ahead of pressure wheel 280, movement of table 302 and board 300 is resumed. When a sufficient length of the stripped conductor required for staking in the second terminal of the pair of terminals being joined by the conductor has passed outward throught the end of guide block 78, air cylinders 102, 104 are activated, engaging conductor grippers 98, 100 with conductor 32 therebetween and air cylinder 86 is activated, advancing knife blade 80 and severing the conductor intermediate the ends of the stripped section, FIG. 21(j) and the remaining end of the adhesive activated coated conductor is applied and affixed or scribed to the board surface with the stripped conductor end over the second terminal hole. Movement of table 302, with circuit board 300 thereon and indexed thereto is stopped. Air cylinder 182 is deactivated, pressure wheel 280 is lifted, indexer head 162 on indexer base 160 is rotated 180 Degrees to bring staker 200 into position over the terminal hole, FIG. 21(l) and staker 200 is activated, FIG. 21(m), to stake the stripped end of the conductor in the terminal hole. Air cylinder 81 is deactivated and conductor guide block 78 is retracted with the lead end of conductor 32 therein stripped and ready for attachment to the first of the next pair of terminal points to be joined when the afore described operation of the apparatus is repeated.

The apparatus of the instant invention, as has already been noted, is adapted to add one or a plurality of conductors to a circuit board and to duplicate the addition to a plurality of boards, each board being provided with identically located indexing holes 308, 310 and being position on table 302 on pins 304, 306 and the program followed in applying the conductors to one board being duplicated on the others. In addition to adding conductors to circuit boards already provided with circuit patterns, the apparatus of the instant invention may be employed to affix, apply or scribe circuit patterns to a board without existing patterns so long as such board has terminal points with holes for staking the conductor ends.

The terms and expressions which have been employed herein are used as terms of description and not of limitation, and there is no intention, in the use of such terms and expressions, of excluding any equivalents of the features shown and described or portions thereof, but it is recognized that various modifications are possible within the scope of the invention claimed.

We claim:

1. An apparatus for scribing a conductor to a surface of a substrate in a predetermined pattern between two points on said surface, each of said points defining a terminal point, said conductor being coated with a coating which is non-tacky and non-blocking in its coated state but activatable to be an adhesive at the time the conductor is applied to said surface and to return to a non-tacky state after said conductor is fixed to said surface, said apparatus including means for feeding said coated conductor to the first of the pair of terminal points on said surface to be connected by said conductor, mean for supplying the end of said conductor to said first terminal point on said surface, tacking means comprising radiant heating means directed at a point on the conductor adjacent the terminal point to activate said adhesive coating to a tacky state and a tacker for fixing the supplied end of said conductor to said first terminal point prior to scribing a conductor path, means for moving said surface and said conductor feeding means relative to each other along a predetermined path from said first of said pair of terminal points to the second of said pair of terminal points, said radiant means activating said coating to an adhesive state as said conductor is applied to said surface, pressure means for urging said conductor with said activated adhesive coating into contact with said surface along said predetermined path, means for cutting the end of said conductor, means for applying said cut end of said conductor to said second of said terminal points and means for fixing said conductor end to said second terminal point.

2. An apparatus, as recited in claim 1, in which said radiation is heat and said radiation source is a heat source.

3. An apparatus, as recited in claim 1, in which said radiation is from a laser source and said radiation source is a laser beam.

4. An apparatus, as recited in claim 3, in which said laser beam is a CO2 laser beam.

5. An apparatus, as recited in claim 1, in which said means for feeding said conductor to said surface is a feeder head.

6. An apparatus, as recited in claim 5, in which said means for feeding said conductor includes a variable speed motor in said feeder head and means in said head for controlling the speed of said motor.

7. An apparatus, as recited in claim 5, in which said feeder head includes a conductor guide block and means for moving said conductor guide block relative to said feeder head and toward said surface for applying the end of said conductor to said first terminal point and for retracting said conductor guide block when said applied end of said conductor is fixed to said terminal point.

8. An apparatus, as recited in claim 7, in which said conductor guide block includes means for gripping said conductor to advance the end of said conductor toward said surface when said conductor guide block is advanced toward said surface and for releasing said conductor.

9. An apparatus, as recited in claim 8, in which said conductor guide block includes means for stripping said coating from a section of said conductor to expose said conductor while said conductor is held in said guide block.

10. An apparatus, as recited in claim 9, in which said coating is stripped from conductor by applying heat to said section to vaporize said coatings.

11. An apparatus, as recited in claim 10, in which a vacuum is applied as said coating is vaporized.

12. An apparatus, as recited in claim 11, in which an air blast is applied to remove residue after said coating is vaporized.

13. An apparatus, as recited in claim 1, in which said pressure means includes a wheel and means for bringing said wheel into pressure contact with said conductor after said conductor has been applied for said fixed conductor to said base.

14. An apparatus, as recited in claim 13, in which said means for bringing said wheel into pressure contact with said conductor includes an indexing head and said means for fixing the applied end of said conductor to said first terminal point is mounted on said indexing head.

15. An apparatus, as recited in claim 1, in which said first and second terminnal points are metalized through holes in said substrate.

16. An apparatus, as recited in claim 15, in which said substrate is a circuit board.

17. An apparatus for scribing a conductor to a surface of a substrate in a predetermined pattern between two points on said surface, each of said points defining a terminal point, said conductor being coated with a coating which is non-tacky and non-blocking in its coated state but activatable to be an adhesive at the time the conductor is applied to said surface and to return to a non-tacky state after said conductor is fixed to said surface, said apparatus including a feeder head for feeding said coated conductor to the first of the pair of terminal points on said surface, said feeder head including a variable speed motor within the feeder head and means for controlling the speed of said motor, to be connected by said conductor, means for supplying the end of said conductor to said first terminal point to scribe a conductor path, means for moving said surface and said feeder head relative to each other along a predetermined path from said first of said pair of terminal points to the second of said pair of terminal points, means for activating said coating as said conductor is applied to said surface, pressure means for urging said conductor with said activated adhesive coating into contact with said surface along said predetermined path, means for cutting the end of said conductor, means for applying said cut end of said conductor to said second of said terminal points and means for fixing said conductor end to said second terminal point, wherein said motor speed control includes a photon-coupled interrupter, a means for controlling the output of said interrupter, a conductor loop in the path of conductor feed and a means for sensing and controlling said loop.

18. An apparatus, as recited in claim 17, in which the speed of said variable speed motor is reduced when said conductor loop is elongated and is increased as said conductor loop is decreased.

19. An apparatus for scribing a conductor to a surface of a substrate in a predetermined pattern between two points on said surface, each of said points defining a terminal point, said conductor being coated with a coating which is non-tacky and non-blocking in its coated state but activatable to be an adhesive at the time the conductor is applied to said surface and to return to a non-tacky state after said conductor is fixed to said surface, said apparatus including means for feeding said coated conductor to the first of the pair of terminal points on said surface to be connected by said conductor, means for supplying the end of said conductor to said first terminal point on said surface, means for fixing the supplied end of said conductor to said first terminal point to scribe a conductor path, means for moving said surface and said conductor feeding means relative to each other along a predetermined path from said first of said pair of terminal points to the second of said pair of terminal points, means for activating said coating to an adhesive state as said conductor is applied to said surface, pressure means for urging said conductor with said activated adhesive coating into contact with said surface along said predetermined path, means for cutting the end of said conductor, means for applying said cut end of said conductor to said second of said terminal points and means for fixing said conductor end to said second terminal point in which said pressure means includes a wheel and means for bringing said pressure wheel into pressure contact with said conductor after said conductor has been applied comprising an indexing head and said means for fixing the applied end of said conductor to said first terminal point being mounted thereon, said indexing head including means for rotating said indexing head to a first position for engaging said fixing means with said conductor and into a second position for engaging said pressure wheel with said conductor.

20. An apparatus for scribing a conductor to a surface of a substrate in a predetermined pattern between two points on said surface, each of said points defining a terminal point, said conductor being coated with a coating which is non-tacky and non-blocking in its coated state but activatable to be an adhesive at the time the conductor is applied to said surface and to return to a non-tacky state after said conductor is fixed to said surface, said apparatus including means for feeding said coated conductor to the first of the pair of terminal points on said surface to be connected by said conductor, means for supplying the end of said conductor to said first terminal point on said surface, means for fixing the supplied end of said conductor to said first terminal point to scribe a conductor path, means for moving said surface and said conductor feeding means relative to each other along a predetermined path from said first of said pair of terminal points to the second of said pair of terminal points, means for activating said coating to an adhesive state as said conductor is applied to said surface, pressure means for urging said conductor with said activated adhesive coating into contact with said surface along said predetermined path, means for cutting the end of said conductor, means for applying said cut end of said conductor to said second of said terminal points and means for fixing said conductor end to said second terminal point wherein said first and second terminal points are metallized through holes in said substrate, said substrate being a circuit board and wherein said fixing means includes staking means for staking the end of said conductor in said through holes.

21. An apparatus, as recited in claim 20, in which said fixing means includes staking means for staking the end of said conductor in said through holes and tacking means for tacking said conductor to said base with said activated adhesive after said end is staked.

* * * * *